United States Patent

Shindoh et al.

[11] Patent Number: 5,532,063
[45] Date of Patent: Jul. 2, 1996

[54] SILICON OXIDE DEPOSITING SOURCE AND COATED FILM

[75] Inventors: Toshihiko Shindoh, Annaka; Takeshi Kakegawa, Tomioka; Kazuhiko Urano; Toshimasa Okamura, both of Annaka; Tetsuo Suzuki; Masatoshi Sato, both of Chigasaki, all of Japan

[73] Assignees: Shin-Etsu Chemical Co., Ltd., Tokyo; Nihon Shinku Gijutsu Kabushiki Kaisha, Kanagawa-ken, both of Japan

[21] Appl. No.: 276,058

[22] Filed: Jul. 15, 1994

[30] Foreign Application Priority Data

Jul. 20, 1993 [JP] Japan ................... 5-200318

[51] Int. Cl.$^6$ .................. B32B 9/04; C09D 1/00
[52] U.S. Cl. .......... 428/446; 75/252; 106/286.1; 106/287.1; 106/482; 427/248.1; 427/452; 427/567; 501/154
[58] Field of Search ............ 427/248.1, 452, 427/453, 567, 568; 428/446; 75/252; 106/286.1, 287.1, 482; 501/154

[56] References Cited

U.S. PATENT DOCUMENTS 5,085,904  2/1992  Deak et al. ................. 428/35.7

FOREIGN PATENT DOCUMENTS 152120  11/1981  European Pat. Off. .
159003  2/1983   European Pat. Off. .

OTHER PUBLICATIONS

Patent Abstracts of Japan, vol. 016, No. 194 (C-0938) 11 May 1992 & JP-A-04 028 858 (Mitsubishi Heavy Ind Ltd.) 31 Jan. 1992.

Primary Examiner—D. S. Nakarani
Attorney, Agent, or Firm—McAulay Fisher Nissen Goldberg & Kiel

[57] ABSTRACT

A silicon oxide depositing source is a mixture of a metallic silicon powder and a silicon dioxide powder. Both the powders are finely divided to a mean particle size of up to 20 μm. They are mixed to give an oxygen to silicon atom ratio between 1.2:1 and 1.7:1. The source is adapted to be evaporated by an electron beam heating technique, allows the power of an electron beam to be increased without a splash phenomenon, and eventually deposits a silicon oxide thin film having transparency and improved barrier properties.

2 Claims, 1 Drawing Sheet

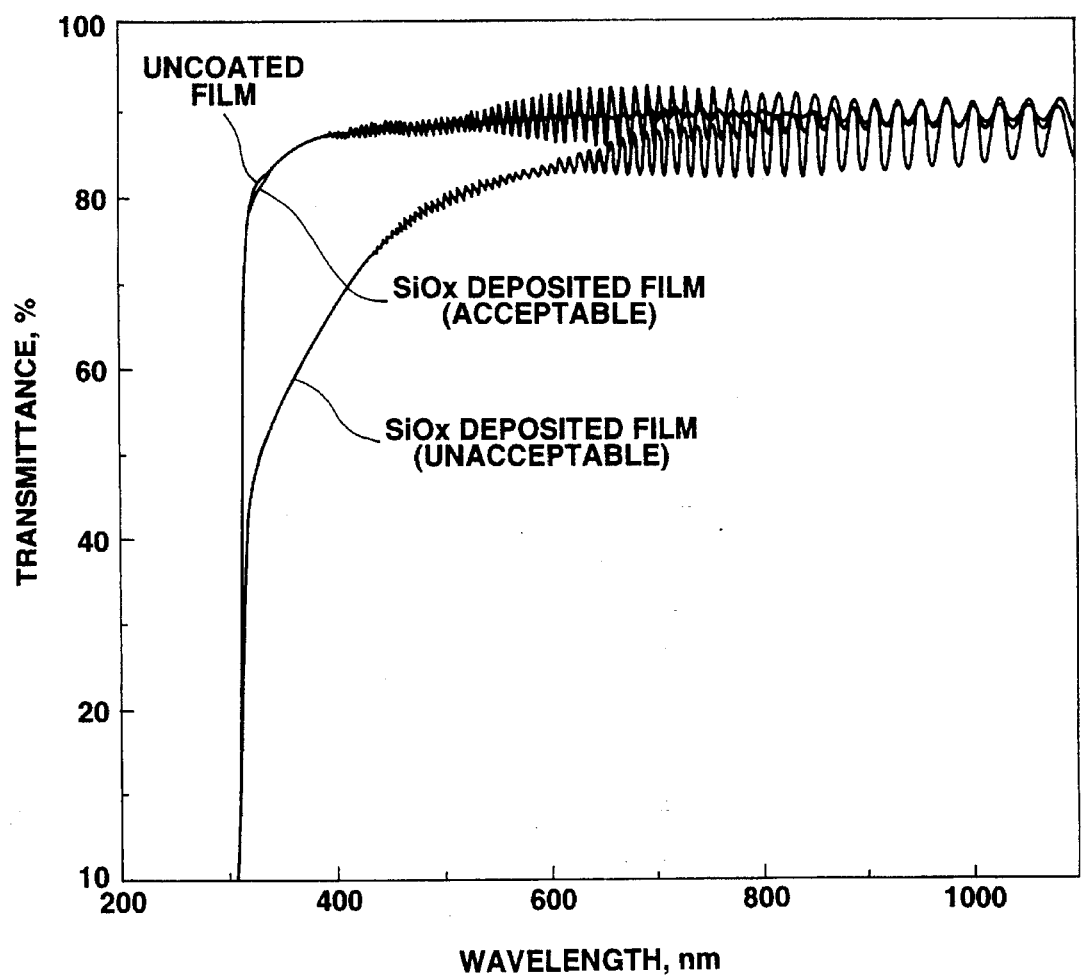

SILICON OXIDE DEPOSITING SOURCE AND COATED FILM

BACKGROUND OF THE INVENTION

1. Field of the Invention

This invention relates to a silicon oxide depositing source and more particularly, a silicon oxide depositing source which lends itself to vacuum deposition by electron beam heating to form a silicon oxide thin film having transparency and barrier properties in high yields. It also relates to a plastic film having such a silicon oxide coating deposited thereon.

2. Prior Art

Transparent barrier films are manufactured by evaporating and depositing a silicon oxide thin coating on plastic web as disclosed in Japanese Patent Publication (JP-B) No. 12953/1978 and Japanese Patent Application Kokai (JP-A) No. 253434/1989. Induction heating and resistance heating techniques are conventional for such evaporation. Recently, sputtering and electron beam heating techniques are employed for the purpose of improving film properties. The depositing source also experiences a transition from silicon monoxide alone to a mixture of metallic silicon and silicon dioxide partly because of low cost.

Among the evaporating techniques, the electron beam heating technique has the advantage of achieving efficient evaporation by locally concentrating the energy of an electron beam, but, as described in JP-A 15526/1991, suffers from a lowering of vacuum and an unstable deposition rate upon evaporating metal oxide. As the power of an electron beam is increased the beam can be disturbed due to charge build-up of electrons and grains of the deposition source can be splashed as such without being vaporized, which is known as a splash phenomenon. These deteriorate the film quality.

One countermeasure is to mix a metal such as magnesium and aluminum with the metal oxide. When a mixture of metallic silicon and silicon dioxide was evaporated on a transparent plastic web, it was difficult to produce a thin film which satisfied both full colorless transparency and barrier properties.

For these reasons, the electron beam heating technique as applied to the evaporation of a mixture of metallic silicon and silicon dioxide is rather low in deposition rate and hence, productivity as compared with the resistance heating and induction heating techniques.

SUMMARY OF THE INVENTION

Therefore, an object of the present invention is to provide a silicon oxide depositing source which is subject to evaporation and deposition by the electron beam heating technique, is able to maintain a stable evaporation state even when the power of an electron beam is increased, and is thus able to form a silicon oxide thin film of improved transparency and barrier properties in high yields and with good productivity because of an increased deposition rate. Another object is to provide a plastic film which is coated by evaporating such a source.

The present invention is directed to a silicon oxide depositing source comprising a metallic silicon powder and a silicon dioxide powder. According to the present invention, both the metallic silicon powder and the silicon dioxide powder have a mean particle size of up to 20 μm. The source has a controlled atomic ratio of oxygen atom to silicon atom which is set in the range of from 1.2:1 to 1.7:1.

The evaporation source in the form of a mixture of metallic silicon powder and silicon dioxide powder is conventionally a coarse powder having a mean particle size of several hundred micrometers to several millimeters. Quite unexpectedly, we have found that significant improvements are achieved by finely dividing such source powder into particles having a mean particle size of less than about 20 μm to thereby increase the surface area. When the fine source powder is evaporated and deposited by the electron beam heating technique, charge build-up of electrons is restrained so that a stable evaporation state is maintained even when the power of an electron beam is increased, resulting in increased yields. Since evaporation can be done with an increased powder and at a higher rate, the process if improved in productivity. Furthermore, by controlling the atomic ratio of oxygen atom to silicon atom to fall in the range of from 1.2:1 to 1.7:1, there is obtained a silicon oxide thin film which satisfies both transparency and barrier requirements. Then a plastic film having such a silicon oxide thin film deposited thereon exhibits improved transparency and barrier properties. The coated plastic film is also contemplated herein.

BRIEF DESCRIPTION OF THE DRAWINGS

The only FIGURE, FIG. 1 is a diagram showing the transmittance of polyester films having silicon oxide deposited thereon.

DETAILED DESCRIPTION OF THE INVENTION

The silicon oxide depositing source of the present invention is a mixture of a metallic silicon powder and a silicon dioxide powder. According to the present invention, both the metallic silicon powder and the silicon dioxide powder have a mean particle size of up to 20 μm, preferably up to 10 μm. The objects of the invention cannot be achieved if the mean particle size exceeds 20 μm. When such a coarse powder mix is evaporated by electron beam heating, an electron beam experiences substantial power disturbances on impingement to give rise to a splash phenomenon. It is then difficult to increase the beam power and the deposition rate remains low.

According to the present invention, the atomic ratio of oxygen atom to silicon atom (O/Si) in the metallic silicon and silicon dioxide powders is controlled to fall in the range of from 1.2:1 to 1.7:1, preferably from 1.3:1 to 1.6:1. If the O/Si ratio is less than 1.2, the deposited film exhibits pale yellow and is less transparent. If the O/Si ratio is more than 1.7, the deposited film is exacerbated in barrier properties.

While the silicon oxide depositing source of the present invention uses the metallic silicon and silicon dioxide powders which meet the above-defined particle size and O/Si requirements, these powders may be conventional with respect to their purity and other physical properties. Further, the source may consist of the metallic silicon and silicon dioxide powders although another ingredient can be added thereto insofar as the objects of the present invention are not impaired. Such other ingredients include silicon monoxide, silicon nitride and silicon carbide.

The silicon oxide depositing source of the present invention is particularly adapted to be evaporated by electron beam heating and deposited on transparent plastic web. A silicon oxide thin film having transparency and improved barrier properties is deposited on the plastic web. The plastic film having such a silicon oxide thin film deposited thereon finds use as food wrap film which withstands microwave oven heating.

In the practice of the invention, the silicon oxide depositing source of the present invention is evaporated by an electron beam heating technique using an electron gun of the conventional Pierce or deflection type. The heating apparatus and technique are not particularly limited and conventional ones may be used without a change.

There has been described a silicon oxide depositing source which because of reduced particle size, is adapted to be evaporated by an electron beam heating technique, allows the power of an electron beam to be increased without a splash phenomenon, and eventually deposits a silicon oxide thin film having transparency and improved barrier properties. The coated film having the silicon oxide thin film deposited thereon is improved in transparency and barrier properties.

The barrier property was evaluated by measuring water vapor transmission by the permeability cup test (JIS Z-0208), with a moisture permeability of up to 5 g/m$_2$·day being rated "Pass".

Film transparency was evaluated by measuring the light transmittance in the visible region of the coated film by means of a spectrophotometer (Ubest-35 by Nippon Bunko K. K.). The coated film was rated "acceptable" (○) when the transmittance was approximately equal to that of an uncoated polyester film of 12 μm thick and "unacceptable" (X) when the transmittance was lower. The results of transmittance measurement are shown in FIG. 1. The unacceptable coated films have a low transmittance in the wavelength range of 300 to 500 nm corresponding to yellow color whereas the acceptable coated films have an equivalent transmittance to the uncoated film over the entire visible region.

TABLE 1

|  | Mean particle size (μm) | | Composition | Deposition rate | Moisture permeability | |
| --- | --- | --- | --- | --- | --- | --- |
|  | Si | SiO$_2$ | (x of SiO$_x$) | (Å/sec.) | (g/m$^2$ · day) | Transparency |
| Example 1 | 18 | 20 | 1.5 | 1100 | 5 | ○ |
| Example 2 | 2 | 2 | 1.5 | 1500 | 2 | ○ |
| Example 3 | 2 | 0.2 | 1.5 | 1600 | 2 | ○ |
| Example 4 | 2 | 0.2 | 1.2 | 1200 | 2 | ○ |
| Example 5 | 2 | 0.2 | 1.7 | 2000 | 5 | ○ |
| Comparative Example 1 | 10 | 30 | 1.5 | 200 | 30 | ○ |
| Comparative Example 2 | 25 | 2 | 1.5 | 400 | 25 | ○ |
| Comparative Example 3 | 2 | 0.2 | 1.1 | 150 | 2 | X |
| Comparative Example 4 | 2 | 0.2 | 1.8 | 2500 | 40 | ○ |

EXAMPLE

Examples of the present invention are given below by way of illustration and not by way of limitation.

Examples 1–5 & Comparative Examples 1–4

Metallic silicon particles and silicon dioxide particles both having the mean particle size shown in Table 1 were mixed so as to give the oxygen/silicon atom ratio shown in Table 1 where it is expressed as x of SiO$_x$. Using a mold press, the mixture was shaped into a rectangular compact of 40 mm×50 mm×15 mm.

The compact and a polyester film of 12 μm thick were set in a vacuum deposition apparatus equipped with a Pierce electron gun. The compact was evaporated by electron beam heating whereby silicon oxide was vacuum deposited on the polyester film. Upon vacuum deposition, an electron beam was emitted with a maximum permissible power capable of maintaining stable evaporation. The deposition was continued until the deposited film reached a thickness of about 500 Å.

The electric power to the electron gun was increased to the maximum at which the electron beam underwent no power disturbance and no splash phenomenon occurred. The deposition rate achieved by electron beam emission at the maximum power was determined. A deposition rate of 1,000 Å/sec. or higher was rated "Pass" while less than 1,000 Å/sec. rated "Rejected".

The coated film was examined for moisture barrier property and transparency.

As seen from Table 1, the deposition rate is low if either one of the silicon and silicon dioxide powders has a mean particle size of more than 20 μm (Comparative Examples 1 and 2). Even when both the silicon and silicon dioxide powders have a mean particle size of less than 20 μm, the silicon oxide coating becomes less transparent if the O-Si ratio is less than 1.2 (Comparative Example 3) and the moisture barrier property becomes low if the O-Si ratio is more than 1.7 (Comparative Example 4).

In contrast, the evaporation source material within the scope of the invention ensure a high deposition rate and provides for silicon oxide films or coatings having excellent barrier property and transparency.

Japanese Patent Application No. 5-200318 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A silicon oxide depositing source comprising a metallic silicon powder and a silicon dioxide powder both having a mean particle size of up to 10 μm, the atomic ratio of oxygen atom to silicon atom being from 1.5:1 to 1.7:1.

2. A coated film comprising a plastic substrate and a coating deposited thereon by evaporating the source of claim 1.

* * * * *